US007777479B2

(12) United States Patent
Huang et al.

(10) Patent No.: US 7,777,479 B2
(45) Date of Patent: Aug. 17, 2010

(54) CURRENT DETECTOR WITH VARIABLE OUTPUT VOLTAGE LEVEL

(75) Inventors: Chen-Chia Huang, Taipei (TW); Huang-Cheng Shih, Taipei Hsien (TW)

(73) Assignee: Wistron NeWeb Corp., Taipei Hsien (TW)

( * ) Notice: Subject to any disclaimer, the term of this patent is extended or adjusted under 35 U.S.C. 154(b) by 1363 days.

(21) Appl. No.: 11/234,696

(22) Filed: Sep. 23, 2005

(65) Prior Publication Data

US 2007/0021061 A1 Jan. 25, 2007

(30) Foreign Application Priority Data

Jul. 19, 2005 (TW) .............................. 94124286 A

(51) Int. Cl.
*G01R 31/28* (2006.01)

(52) U.S. Cl. ................................ 324/158.1; 324/123 R

(58) Field of Classification Search ............. 324/123 R, 324/158.1; 330/256

See application file for complete search history.

(56) References Cited

U.S. PATENT DOCUMENTS 3,814,957 A * 6/1974 Way ............................ 327/512
4,317,054 A * 2/1982 Caruso et al. ............... 327/539
4,804,903 A * 2/1989 Yundt ......................... 324/130
4,910,455 A * 3/1990 Nadd ..................... 324/123 R
5,206,553 A * 4/1993 Imai et al. ................... 327/321
5,257,407 A * 10/1993 Heinzelmann ........... 455/67.11
5,625,305 A * 4/1997 Hwang ........................ 327/78
5,627,494 A * 5/1997 Somerville .................. 330/257
2009/0243564 A1* 10/2009 Kajita ........................ 323/234

* cited by examiner

*Primary Examiner*—Ha Tran T Nguyen
*Assistant Examiner*—Richard Isla Rodas
(74) *Attorney, Agent, or Firm*—Quintero Law Office

(57) ABSTRACT

A current detector with variable output voltage level. The current detector includes an operational amplifier, an adjusting circuit, a load circuit for detecting current running therethrough, and a clamping circuit. The operational amplifier includes a non-inverting input, an inverting input, and an output. The operational amplifier is connected to an antenna power supply and ground. The adjusting circuit is coupled to the inverting input. The load circuit has one end is coupled to the antenna power supply, and the other end coupled to the non-inverting input. The other end of the load circuit is also a detecting node. The non-inverting input is a detecting node. The clamping circuit, coupled to the output of the operational amplifier, clamps the output voltage level of the operational amplifier to a predetermined range. When the detecting node floats, the output voltage level of the clamping circuit is at logic high.

16 Claims, 8 Drawing Sheets

V_ANT
404A 404
$I_{LOAD}$
410
406
402
412
$V_C$
310
414a
402A
Output
408
416

CURRENT DETECTOR WITH VARIABLE OUTPUT VOLTAGE LEVEL

BACKGROUND

The invention relates to current detectors, and more particularly, a current detector which can detect the existence of an active antenna from the currents in a satellite communication system.

FIG. 1 shows a diagram of satellite receiver including an active antenna. Generally, the satellite receiver 12 and active antenna 14 are bought or installed separately. Whenever an active antenna 14 is mounted or not on the satellite receiver 12, the satellite receiver 12 must detect the existence of antenna and inform the user. For example, an antenna detector may act as shown in Table 1.

TABLE 1

The action of an antenna detector

| | Antenna Status | |
|---|---|---|
| | not mounted | mounted |
| Output logic level of antenna detector | Logic High | Logic Low |

An active antenna is with a power supply for receiving satellite signals, while a passive antenna receives satellite signals without any power supply.

FIG. 2 shows a conventional antenna detector 20. The antenna detector 20 comprises an operation amplifier 22 and a resistor 24. The amplifier 22 is coupled to a DC power $V_{cc}$ and ground. The non-inverting input of the operational amplifier 22 is coupled to one end of the resistor 24, and the inverting input of the operational amplifier 22 is coupled to the other end of the resistor 24. The inverting input is also coupled to a load circuit 26. A load current $I_{LOAD}$ through load circuit 26 represents the current for driving an active antenna. The load current $I_{LOAD}$ through the resistor 24 causes the voltage levels of the two inputs of the operational amplifier 22 to be different. The operational amplifier 22 amplifies the voltage difference, and the output of the operational amplifier 22 is at logic high. When no current is passing through the load circuit 26, the active antenna has not been plugged into the satellite receiver. Thus, the voltage difference across two inputs of the operational amplifier 22 is zero, which means the output of the operational amplifier 22 is at logic low.

Conventional antenna detector 20 seems to meet the requirements set in Table 1. The voltage of the power supply of a typical active antenna, however, exceeds 6 volts. When $V_{cc}$ is 6 volts, and an active antenna is plugged into the antenna detector, the output voltage level of the operational amplifier is nearly 6 volts. The operating range of typical logic circuit, however, is 0-3.3 only volts. This means, 3.3 volts are "logic high" as defined by the logic circuit, and a signal with potential of 6 volts may destroy the logic circuit. Thus, the conventional antenna detector fails to meet the requirements listed in Table 1.

SUMMARY

Accordingly, the invention provides a current detector with adjustable output voltage level. The current detector detects the existence of an active antenna from the various current in a satellite system. The current detector includes an operational amplifier, an adjusting circuit, a load circuit for detecting current running there through, and a clamping circuit. The operational amplifier comprises a non-inverting input, an inverting input, and an output. The operational amplifier is coupled to an antenna power supply and ground. The adjusting circuit is coupled to the inverting input. The load circuit has one end coupled to the antenna power supply, and the other end coupled to the non-inverting input. The other end of the load circuit is a detecting node. The clamping circuit, coupled to the output of the operational amplifier, clamps the output voltage level of the operational amplifier to a predetermined range. When the detecting node floats, the output voltage level of the clamping circuit is at logic high.

BRIEF DESCRIPTION OF THE DRAWINGS

The invention will become more fully understood from the detailed description, given herein below, and the accompanying drawings. The drawings and description are provided for purposes of illustration only, and, thus, are not intended to be limiting of the present invention.

DETAILED DESCRIPTION

Figure 3:
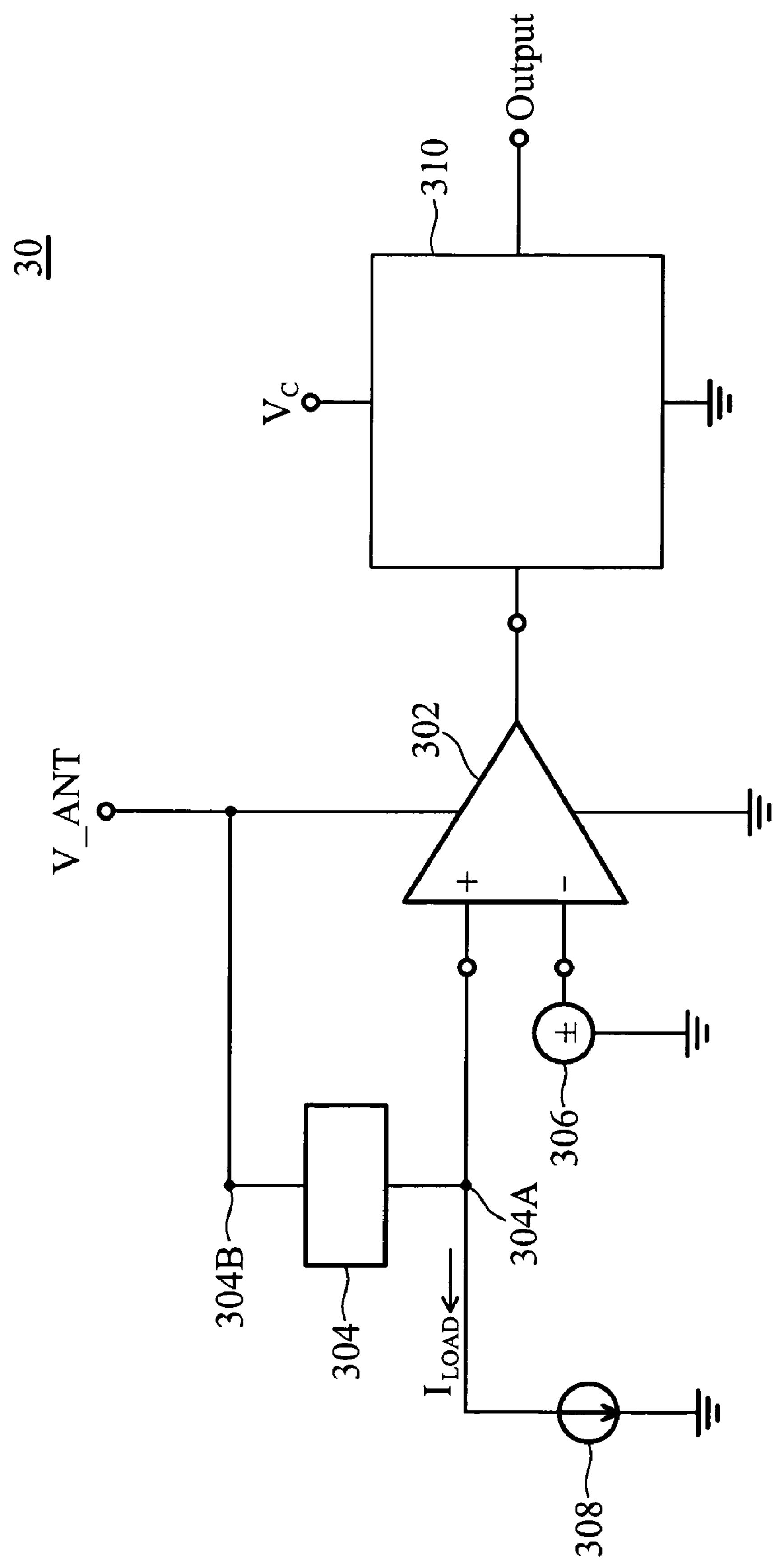
FIG. 3 is an embodiment of a current detector.

Current detectors with variable output voltage level are provided. FIG. 3 depicts an exemplary embodiment of current detector. The antenna power supply V_ANT and ground supply power to the operational amplifier 302. An adjusting circuit 306 couples to an inverting input of the operational amplifier 302 and the antenna power supply V_ANT. One end of the load circuit 304 is coupled to the antenna power supply V_ANT, and the other end of the load circuit 304 is coupled to the non-inverting input of the operational amplifier 302. Node 304A is a detecting node. The active antenna 308 can be selectively connected to the detecting node 304A for detecting current. The output of the operational amplifier 302 is coupled to a clamping circuit 310. The clamping circuit is powered by logic circuit power supply $V_c$ and ground. The clamping circuit 310 clamps the voltage level of the output of the operational amplifier 302 to a desired range. The clamping circuit 310 modifies the output level of the operational amplifier 302 to an operating range of a logic circuit, so that other logic circuits may use the clamped result. The adjusting circuit 306 is referred to as a supply voltage. Adjusting the supply voltage 306 can change the potential of the inverting input.

When the active antenna 308 is connected to the detecting node 304A, the load current $I_{LOAD}$ passes through the load circuit 304, dropping the potential of node 304A. The potential of the inverting input is controlled to be slightly larger than the potential of the node 304A. The output potential of the operational amplifier 302 is near zero voltage. The clamping circuit 310 receives the output of the operational amplifier 302, and then clamps the output to zero voltage. Conversely, when the active antenna 308 is not connected to the detecting node 304A, the potential of the non-inverting input is equal to the antenna power supply V_ANT. Since the voltage level of the non-inverting input exceeds the voltage of the inverting input, the output level of the operational invert 302 is near the level of antenna power supply V_ANT. The clamping circuit 310 receives the output of the operational amplifier 302 then clamps the output level of the operational amplifier 302 to near the logic circuit power supply $V_c$. Thus, the current detector 30 achieves the action described in Table 1.

FIG. 4 depicts another embodiment of a current detector. The load circuit 304 shown in FIG. 3 can be a first resistor 404. The adjusting circuit 306 can comprise a second resistor 406 and a third resistor 408. The clamping circuit 310 can comprise an NPN bipolar junction transistor (BJT) 414, a fourth resistor 412, and a fifth resistor 416. The resistance of resistors 406 and 408 are both larger than the resistance of resistor 404. Thus, the power consumption of resistor 404 is less than resistor 24 a in conventional current detector. The resistance of second and third resistor 406 and 408 are large enough that the current passing through the resistors 406 and 408 is lower, reducing the power consumption on the resistors 406 and 408. In this embodiment, the resistance of the first, second, third, fourth and fifth resistors are 0.1, 27, 47K, 10K, and 10K ohm, respectively.

When the active antenna 410 connects to the detecting node 404A, the load current $I_{LOAD}$ passes through a load circuit 304, decreasing the potential of node 404A. The potential of the inverting input exceeds the potential of node 404A, forcing the output of the operational amplifier 402 to near zero voltage. After receiving the output of the operational amplifier 402, the transistor 414*a* of the clamping circuit works in cut-off mode. Thus, when the active antenna 410 connects to the current detector, the output of the clamping circuit 310 is at logic low. Conversely, if the active antenna 410 is not connected to the detecting node 404A, the voltage level of the non-inverting input is near antenna power supply V_ANT. Since the voltage level of non-inverting input exceeds the voltage of the inverting input, the output level of the operational inverter 402 is near the level of antenna power supply V_ANT. After receiving the output of the operational amplifier 402, the transistor 414*a* of the clamping circuit works in saturation mode. Thus, the output level of the clamp circuit is ($V_c$-$V_{sat}$), wherein $V_{sat}$ is the voltage between the collector and emitter of a transistor working in saturation mode. Generally, $V_{sat}$ is 0.2 volts, thus the voltage level ($V_c$-$V_{sat}$) can be referred to as logic high.

Figure 4A:
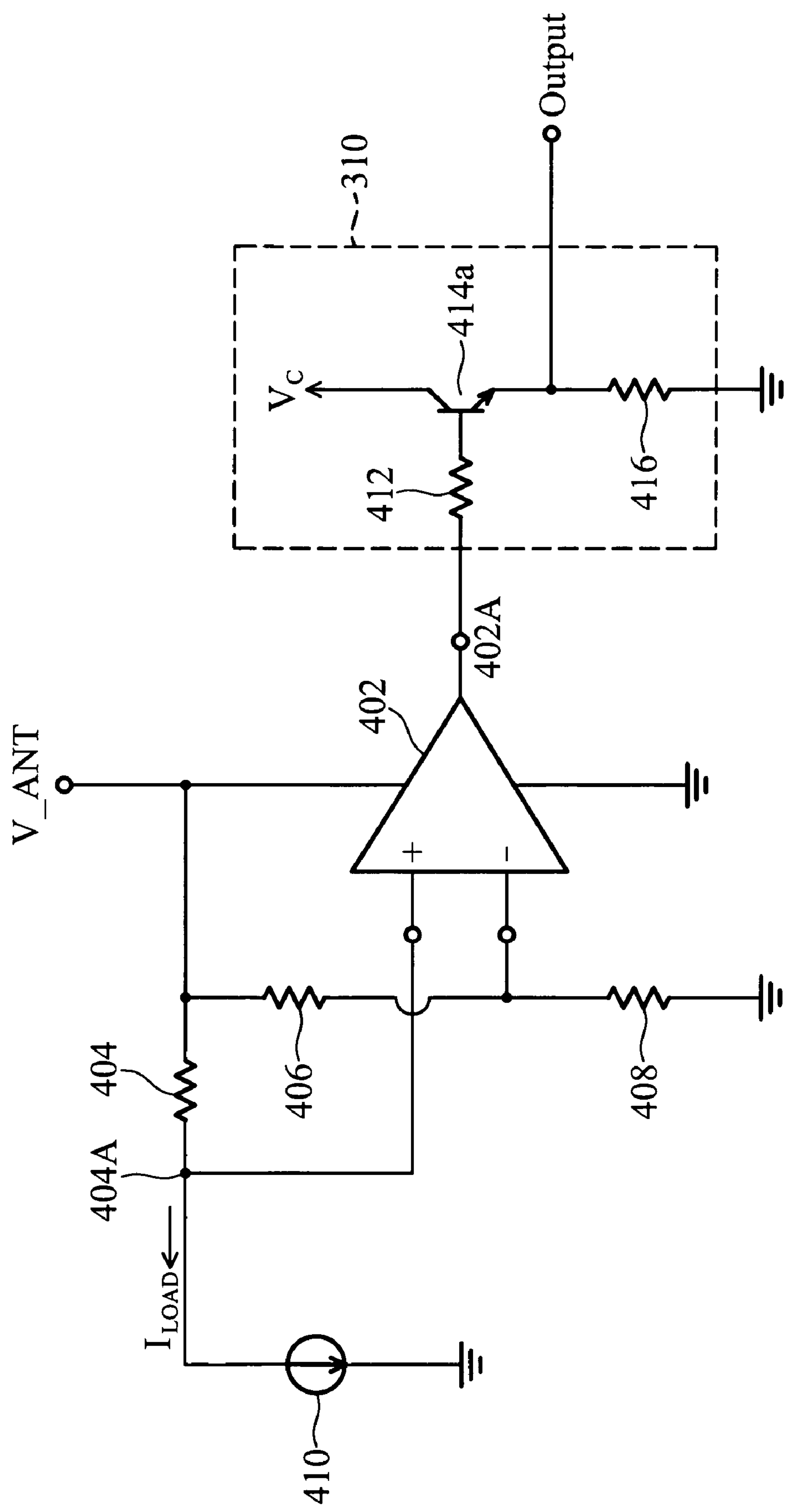
FIG. 4A is another embodiment of a current detector.
Figure 4B:
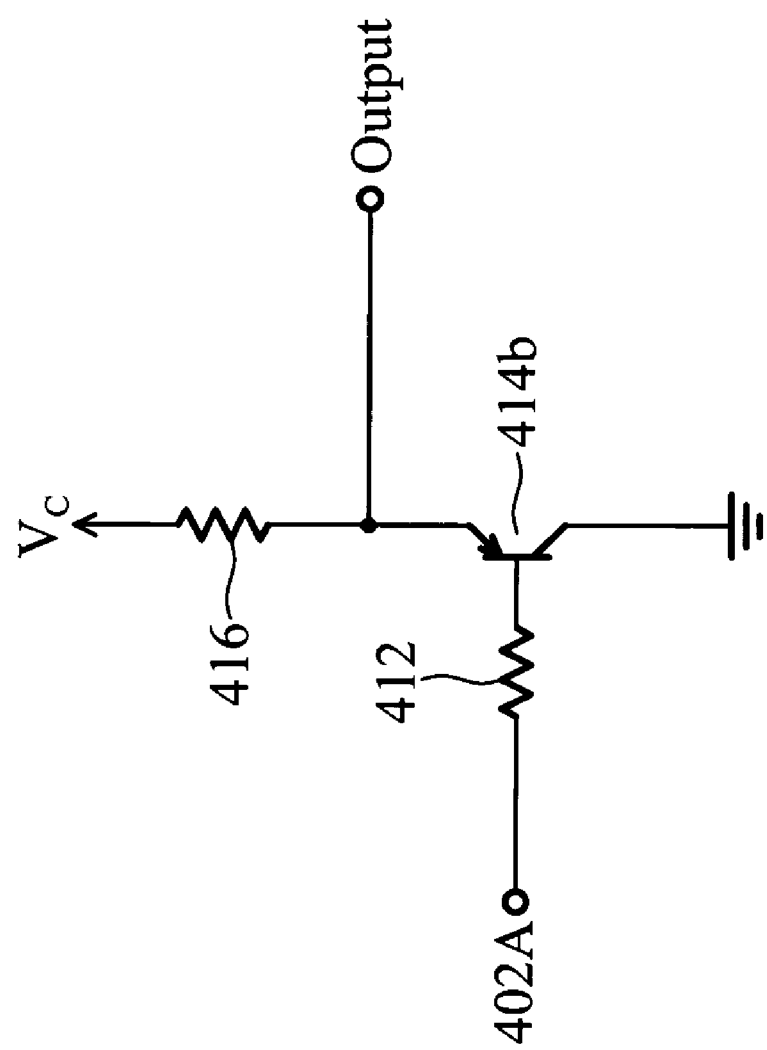
FIG. 4*b* is a clamping circuit implemented by PNP bipolar junction transistor (BJT) in common collector configuration.
Figure 4C:
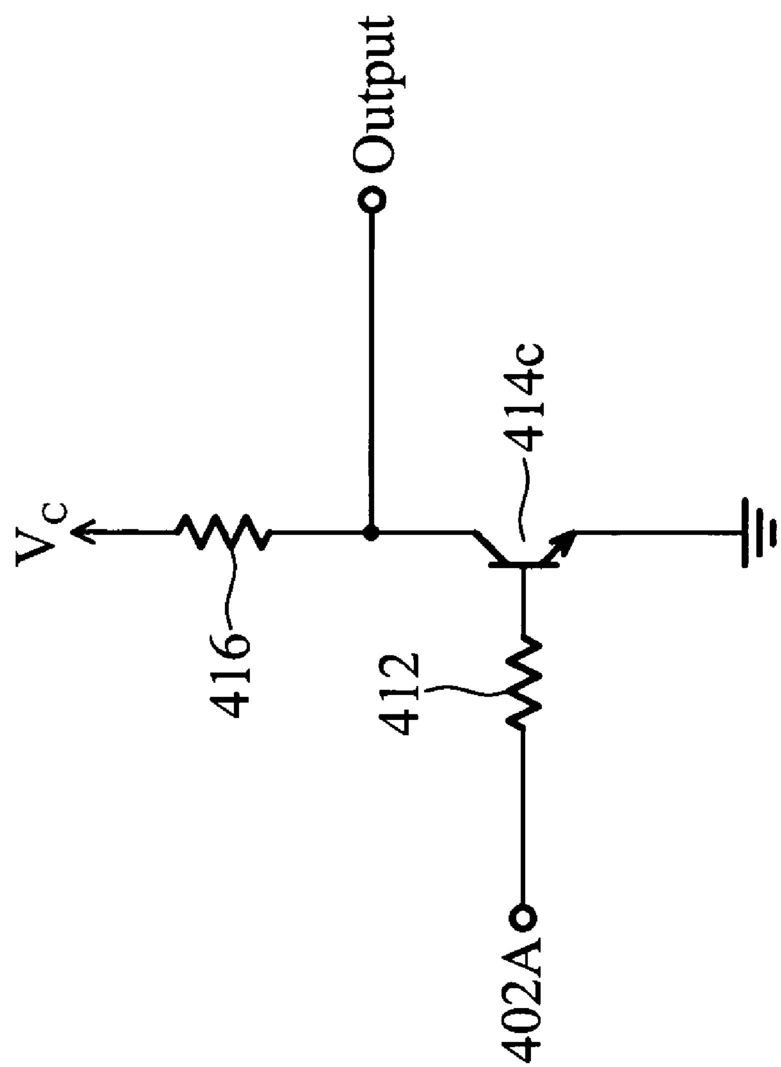
FIG. 4*c* is a clamping circuit implemented by NPN BJT in a common emitter configuration.
Figure 4D:
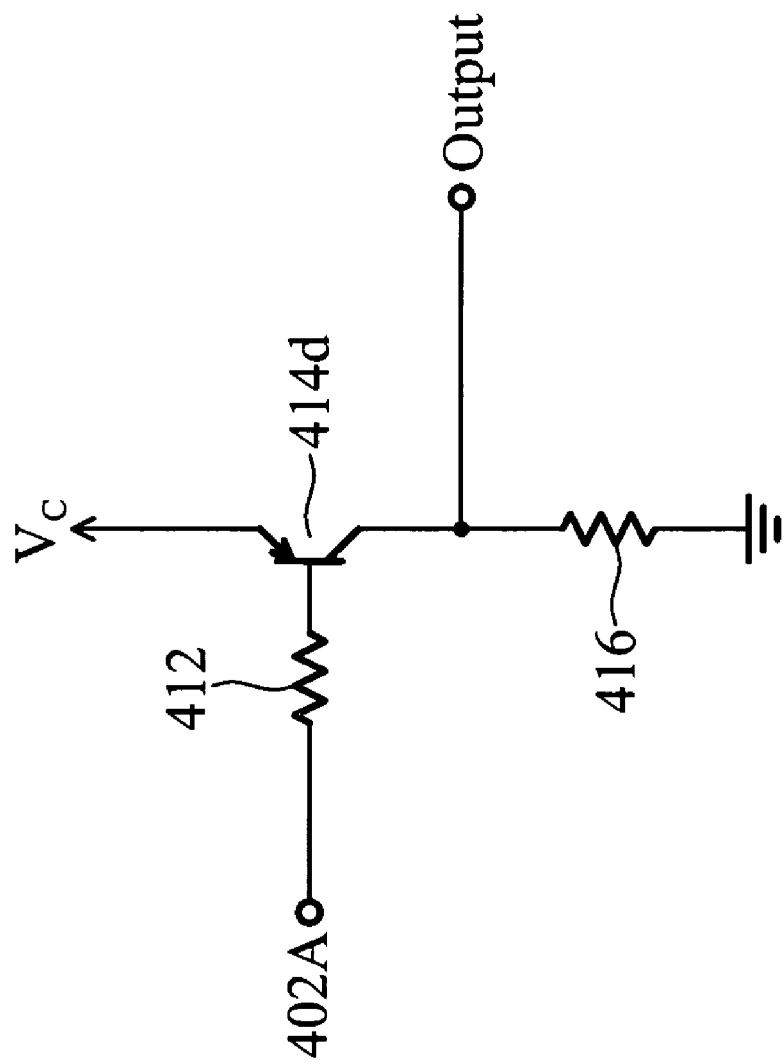
FIG. 4*d* is a clamping circuit implemented by PNP BJT in a common emitter configuration.
Figure 4E:
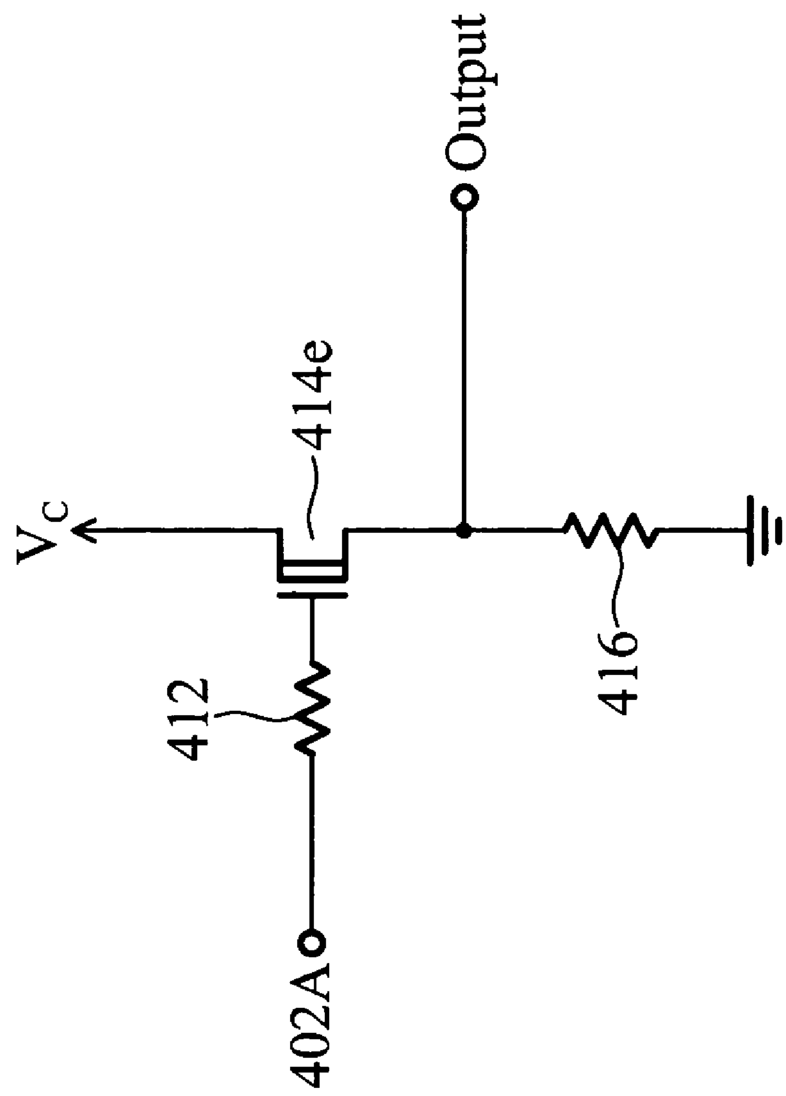
FIG. 4*e* is a clamping circuit constructed by an enhancement NMOS transistor.

In some embodiments of the invention, the configuration of the NPN BJT in the clamping circuit is a common collector. In other embodiments of the invention, the configuration of the NPN BJT may be common emitter. In yet other embodiments of the invention, the NPN BJT can be changed to PNP BJT, enhancement NMOS transistor, as shown in FIGS. 4*b*, 4*c*, 4*d* and 4*e*. FIG. 4*b* shows a clamping circuit implemented by PNP BJT in the common collector configuration. FIG. 4*c* shows NPN BJT in the common emitter configuration. FIG. 4*d* shows PNP in the common collector configuration. FIG. 4*e* shows a clamping circuit constructed by an enhancement NMOS transistor.

In some embodiments of the invention, two supply voltages are provided. One supply voltage powers the active antenna, while the other powers the logic circuit and clamping circuit. Thus, the output level can be adjusted according to the voltage requirement of the logic circuit.

Figure 1:
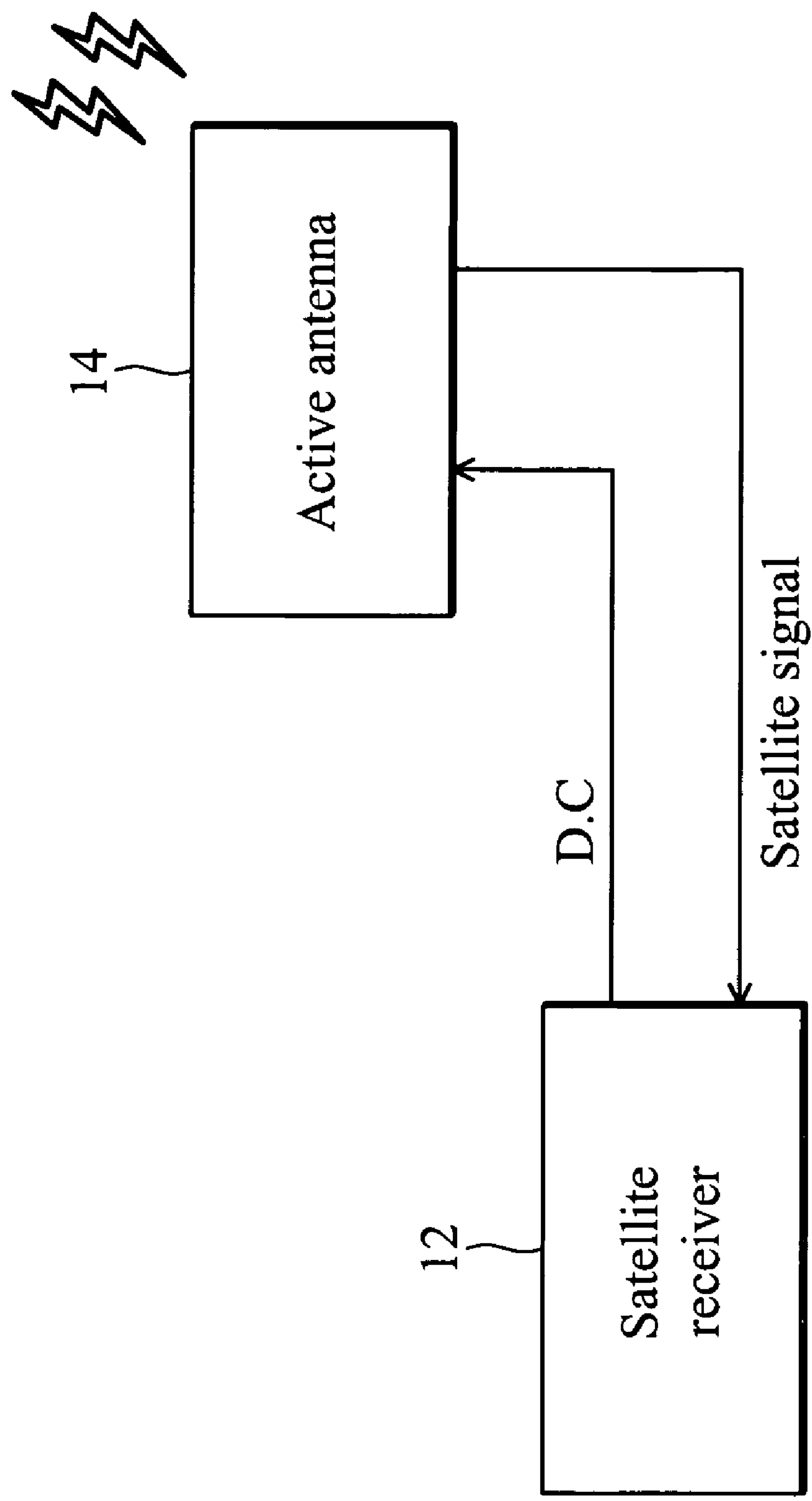
FIG. 1 is a diagram of satellite receiver including an active antenna.
Figure 2:
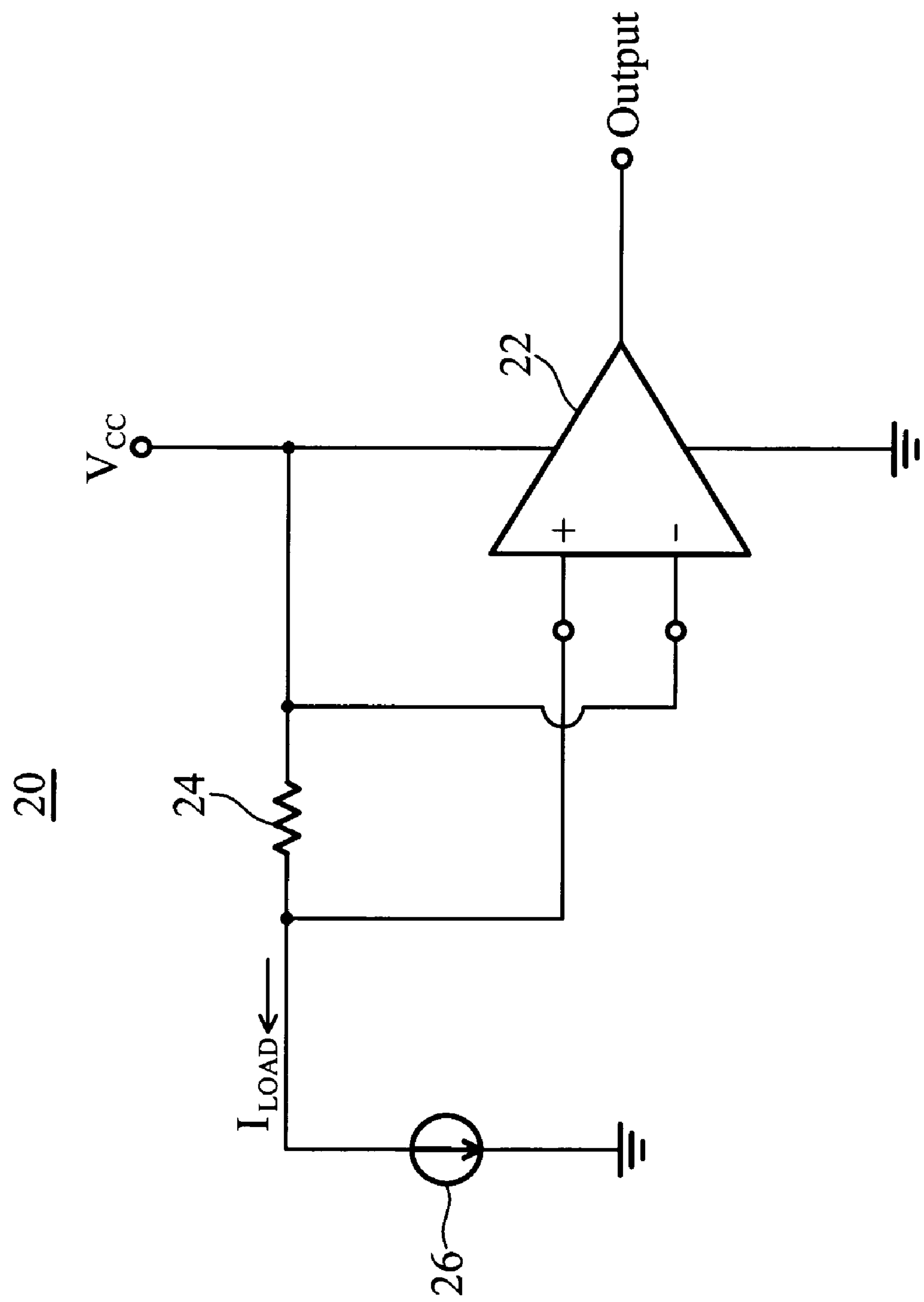
FIG. 2 is a conventional antenna detector.

In the conventional current circuit, as shown in FIG. 2, the resistance of resistor 24 must be large enough to detect the wide range of antenna currents. According to the power consumption formula, a large resistance increases the power consumed on the resistor 24. In the invention, the voltage level of the inverting input can be tuned by the adjusting circuit, so the current antenna provided by the invention not only detects various range of antenna current, but also avoids using large resistance in the adjusting circuit, reducing the power consumed on the adjusting circuit.

Furthermore, the invention is more sensitive, independent of temperature, and tolerant of higher input offset voltage.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current detector with variable output voltage level, comprising:

an operational amplifier coupled to an antenna power supply and ground, having a non-inverting input, an inverting input, and an output;

an adjusting circuit coupled to the inverting input;

a load circuit having one end coupled to the antenna power supply and the other end coupled to the non-inverting input, wherein the other end of the load circuit is also a detecting node;

a clamping circuit coupled to the output of the operational amplifier, clamping the output voltage level of the operational amplifier to a predetermined range; and an object circuit selectively coupled to the detecting node;

wherein the output voltage level of the clamping circuit is at logic high when the object circuit is not coupled to the detecting node, wherein the output voltage level of the clamping circuit is logic low when the object circuit is coupled to the detecting node, and wherein the object circuit is an active antenna.

2. The current detector as claimed in claim 1, wherein the load circuit comprises a first resistor, one end of the first resistor is coupled to the antenna power supply, and the other end is coupled to the non-inverting input.

3. The current detector as claimed in claim 2, wherein the adjusting circuit comprises a second and a third resistor connected serially, and one end of the second resistor is coupled to the antenna power supply, the other end of the second resistor is coupled to one end of the third resistor, and the other end of the third resistor is coupled to the ground.

4. The current detector as claimed in claim 3, wherein the resistance of the third resistor exceeds the resistance of the second resistor, and the resistance of the second resistor exceeds that of the first resistor.

5. The current detector as claimed in claim 4, wherein the resistance of the first resistor is about 0.1 ohms.

6. The current detector as claimed in claim 4, wherein the resistance of the second resistor is about 27 ohms.

7. The current detector as claimed in claim 4, wherein the resistance of the third resistor is about 47k ohms.

8. The current detector as claimed in claim 1, wherein the voltage level of logic high is in a range between 3.3 and 2.0 volts.

9. The current detector as claimed in claim 1, wherein the voltage level of logic low is in a range between 0 and 1.0 volts.

10. The current detector as claimed in claim 1, wherein the clamping circuit further comprises a fourth resistor, a fifth resistor, and an NPN bipolar junction transistor (BJT); one end of the fourth resistor is coupled to the output of the operational amplifier, and the other end of the fourth resistor is coupled to the base of the NPN BJT; one end of the fifth resistor is coupled to the emitter of the NPN BJT, and the other end of the fifth resistor is coupled to ground; the collector of the NPN BJT is coupled to a logic circuit power supply, and the emitter of the NPN BJT is the output of the clamping circuit.

11. The current detector as claimed in claim 1, wherein the clamping circuit further comprises a fourth resistor, a fifth resistor, and a PNP bipolar junction transistor (BJT); one end of the fourth resistor is coupled to the output of the operational amplifier, and the other end of the fourth resistor is coupled to the base of the PNP BJT; one end of the fifth resistor is coupled to the emitter of the PNP BJT, and the other end of the fifth resistor is coupled to a logic circuit power supply; the collector of the PNP BJT is coupled to ground, and the emitter of the PNP BJT is the output of the clamping circuit.

12. The current detector as claimed in claim 1, wherein the clamping circuit further comprises a fourth resistor, a fifth resistor, and an enhancement N-type Metal-Oxide-Semiconductor (NMOS) transistor; one end of the fourth resistor is coupled to the output of the operational amplifier, and the other end of the fourth resistor is coupled the gate of the enhancement NMOS transistor; one end of the fifth resistor is coupled to drain of the enhancement NMOS transistor, and the other end of the fifth resistor is coupled to ground; the source of the enhancement NMOS transistor is coupled to a logic circuit power supply, and the drain of the enhancement NMOS transistor is the output of the clamping circuit.

13. The current detector as claimed in claim 10, wherein the logic circuit power supply provide less voltage than the antenna power supply.

14. The current detector as claimed in claim 1, wherein the clamping circuit further comprises a fourth resistor, a fifth resistor, and an NPN bipolar junction transistor (BJT); one end of the fourth resistor is coupled to the output of the operational amplifier, and the other end of the fourth resistor is coupled to the base of the NPN BJT; one end of the fifth resistor is coupled to the collector of the NPN BJT, and the other end of the fifth resistor is coupled to a logic circuit power supply; the emitter of the NPN BJT is coupled to ground; and the collector is the output of the clamping circuit.

15. The current detector as claimed in claim 1, wherein the clamping circuit further comprises a fourth resistor, a fifth resistor, and a PNP bipolar junction transistor (BJT); one end of the fourth resistor is coupled to the output of the operational amplifier, and the other end of the fourth resistor is coupled to the base of the PNP BJT; one end of the fifth resistor is coupled to the collector of the PNP BJT, and the other end of the fifth resistor is coupled to ground; the emitter of the PNP BJT is coupled to a logic circuit power supply, and the collector of PNP BJT is the output of the clamping circuit.

16. The current detector as claimed in claim 14, wherein the logic circuit power supply provide less voltage than the antenna power supply.

* * * * *